United States Patent
Liu et al.

(10) Patent No.: US 9,831,091 B2
(45) Date of Patent: Nov. 28, 2017

(54) PLASMA TREATING A PROCESS CHAMBER

(71) Applicant: Applied Materials, Inc., Santa Clara, CA (US)

(72) Inventors: Wei Liu, San Jose, CA (US); Theresa Kramer Guarini, San Jose, CA (US); Huy Q. Nguyen, San Jose, CA (US); Malcolm Bevan, Santa Clara, CA (US); Houda Graoui, Gilroy, CA (US); Philip A. Bottini, Santa Clara, CA (US); Bernard L. Hwang, Santa Clara, CA (US); Lara Hawrylchak, Gilroy, CA (US); Rene George, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/171,001

(22) Filed: Jun. 2, 2016

(65) Prior Publication Data
US 2016/0358781 A1 Dec. 8, 2016

Related U.S. Application Data (60) Provisional application No. 62/175,959, filed on Jun. 15, 2015, provisional application No. 62/171,921, filed on Jun. 5, 2015.

(51) Int. Cl.
*H01L 21/3105* (2006.01)
*H01L 21/28* (2006.01)
*H01L 29/51* (2006.01)

(52) U.S. Cl.
CPC .... *H01L 21/28176* (2013.01); *H01L 21/3105* (2013.01); *H01L 29/517* (2013.01)

(58) Field of Classification Search
CPC ........... H01L 21/28176; H01L 21/3105; H01L 21/67253
See application file for complete search history.

(56) References Cited

U.S. PATENT DOCUMENTS

| | | | |
|---|---|---|---|
| 7,605,008 B2 | 10/2009 | Chua et al. | |
| 2005/0191830 A1* | 9/2005 | Collins | H01J 37/32082 438/514 |

(Continued)

FOREIGN PATENT DOCUMENTS

| | | |
|---|---|---|
| JP | 2013-187341 A | 9/2013 |
| KR | 10-1999-0052481 A | 7/1999 |
| KR | 10-2007-0034811 | 3/2007 |

OTHER PUBLICATIONS

PCT Notification of Transmittal of the International Search Report and the Written Opinion of the International Searching Authority for International Application No. PCT/US2016/032728; dated Jul. 29, 2016; 11 total pages.

*Primary Examiner* — Kyoung Lee
*Assistant Examiner* — Christina Sylvia
(74) *Attorney, Agent, or Firm* — Patterson + Sheridan LLP (57) ABSTRACT

Embodiments described herein generally relate to a method and apparatus for plasma treating a process chamber. A substrate having a gate stack formed thereon may be placed in a process chamber, and hydrogen containing plasma may be used to treat the gate stack in order to cure the defects in the gate stack. As the result of hydrogen containing plasma treatment, the gate stack has lower leakage and improved reliability. To protect the process chamber from $H_x^+$ ions and H* radicals generated by the hydrogen containing plasma, the process chamber may be treated with a plasma without the substrate placed therein and prior to the hydrogen containing plasma treatment. In addition, components of the (Continued)

process chamber that are made of a dielectric material may be coated with a ceramic coating including an yttrium containing oxide in order to protect the components from the plasma.

10 Claims, 9 Drawing Sheets

(56) References Cited

U.S. PATENT DOCUMENTS

| | | |
|---|---|---|
| 2010/0089316 A1 | 4/2010 | Saki |
| 2010/0239781 A1 | 9/2010 | Sano et al. |
| 2012/0061676 A1* | 3/2012 | Egi .................. H01L 29/78618 257/60 |
| 2013/0017644 A1* | 1/2013 | Carter, III ........... C23C 16/4405 438/57 |
| 2013/0273313 A1 | 10/2013 | Sun et al. |

* cited by examiner

PLASMA TREATING A PROCESS CHAMBER

CROSS-REFERENCE TO RELATED APPLICATIONS

This application claims priority to U.S. Provisional Patent Application Ser. No. 62/171,921, filed on Jun. 5, 2015, and to U.S. Provisional Patent Application Ser. No. 62/175,959, filed on Jun. 15, 2015, which herein are incorporated by reference.

BACKGROUND

Field

Embodiments described herein generally relate to a method and apparatus for processing semiconductor substrates, more particularly, to a method for plasma treating a process chamber.

Description of the Related Art

Integrated circuits (ICs) are composed of many, e.g., millions, of devices such as transistors, capacitors, and resistors. Transistors, such as field effect transistors (FETs), typically include a source, a drain, and a gate stack. The gate stack generally includes a substrate, such as a silicon substrate, a gate dielectric, and a gate electrode, such as polycrystalline silicon, on the gate dielectric. The gate dielectric layer is formed of dielectric materials such as silicon dioxide ($SiO_2$), or a high-k dielectric material having a dielectric constant greater than 4.0, such as SiON, SiN, hafnium oxide ($HfO_2$), hafnium silicate ($HfSiO_2$), hafnium silicon oxynitride (HfSiON), zirconium oxide ($ZrO_2$), zirconium silicate ($ZrSiO_2$), barium strontium titanate ($BaSrTiO_3$, or BST), lead zirconate titanate ($Pb(ZrTi)O_3$, or PZT), titanium nitride (TiN) and the like. In some cases, the gate dielectric includes a stack of dielectric layers, such as $SiO_2/HfO_2/TiN$ stack disposed on the silicon substrate. It should be noted, however, that the film stack may include layers formed of other materials.

Defects such as atomic vacancies are common in the dielectric layers, for example, O vacancies in $HfO_2$ layer. Other defects such as interfacial defects (dangling bonds for example) are also common in various interfaces such as $TiN/HfO_2$ or $HfO_2/SiO_2$. Atomic vacancies and interfacial defects can cause leakage, thermal instability, mobility instability, and transient threshold voltage instability. Therefore, an improved apparatus and method are needed.

SUMMARY

Embodiments described herein generally relate to a method and apparatus for plasma treating a process chamber. In one embodiment, a method includes plasma treating a process chamber with a plasma containing nitrogen or oxygen, placing a substrate into the process chamber, a stack is disposed on the substrate, and plasma treating the stack disposed on the substrate.

In another embodiment, a method includes introducing a first one or more gases into a process chamber, energizing the first one or more gases into a first plasma, placing a substrate into the process chamber, a stack is disposed on the substrate, introducing a second one or more gases into the process chamber, and energizing the second one or more gases into a second plasma.

In another embodiment, a method includes introducing a first one or more gases into a process chamber, and the first one or more gases includes $O_2$, $N_2$, $NH_3$, Ar, $H_2$, or combination thereof. The method further includes energizing the first one or more gases into a first plasma, placing a substrate into the process chamber, a stack is disposed on the substrate, introducing a second one or more gases into the process chamber, and the second one or more gases includes $H_2$. The method further includes energizing the second one or more gases into a second plasma.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to a method and apparatus for plasma treating a process chamber. A substrate having a gate stack formed thereon may be placed in a process chamber, and hydrogen containing plasma may be used to treat the gate stack in order to cure the defects in the gate stack. As the result of hydrogen containing plasma treatment, the gate stack has lower leakage and improved reliability. To protect the process chamber from $H_x^+$ ions and H* radicals generated by the hydrogen containing plasma, the process chamber may be treated with a plasma without the substrate placed therein and prior to the hydrogen containing plasma treatment. In addition, components of the process chamber that are made of a dielectric material may be coated with a ceramic coating including an yttrium containing oxide in order to protect the components from the plasma.

Figure 1:
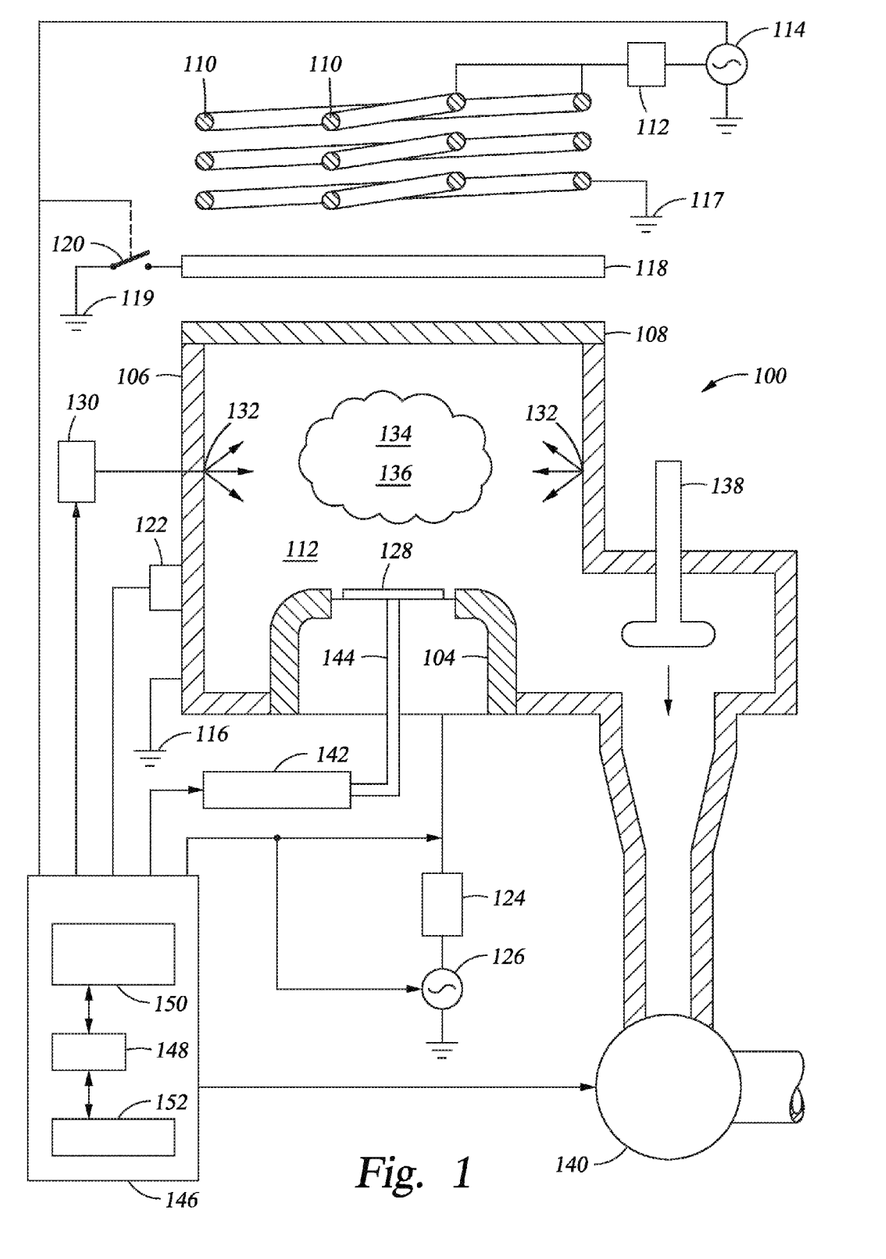
FIG. 1 is a schematic cross sectional view of a process chamber according to embodiments described herein.

FIG. 1 is a schematic cross sectional view of a process chamber 100 according to embodiments described herein. The process chamber 100 may be any suitable plasma process chamber, such as an inductively coupled plasma (ICP) process chamber. As shown in FIG. 1, the process chamber 100 may include a chamber wall 106, a chamber lid 108 and a substrate support pedestal 104 disposed within the chamber wall 106. Typically, the chamber wall 106 is coupled to an electrical ground 116. The chamber lid 108 may be composed of any suitable dielectric, such as quartz. For some embodiments, the dielectric lid 108 may assume a different shape (e.g., dome-shaped). The chamber lid 108 may be coated with a ceramic coating, such as an yttrium containing oxide, in order to protect the chamber lid 108 from $H_2$ plasma. In one embodiment, the ceramic coating is a high performance material (HPM) that is composed of a compound $Y_4Al_2O_9$ and a solid solution $Y_{2-x}Zr_xO_3$ ($Y_2O_3$—$ZrO_2$ solid solution). In one embodiment, the HPM ceramic contains 77% $Y_2O_3$, 15% $ZrO_2$ and 8% $Al_2O_3$. In another embodiment, the HPM ceramic contains 63% $Y_2O_3$, 23% $ZrO_2$ and 14% $Al_2O_3$. In still another embodiment, the HPM ceramic contains 55% $Y_2O_3$, 20% $ZrO_2$ and 25% $Al_2O_3$. Relative percentages may be in molar ratios. For example, the HPM ceramic may contain 77 mol % $Y_2O_3$, 15 mol % $ZrO_2$ and 8 mol % $Al_2O_3$. Other distributions of these ceramic powders may also be used for the HPM material. The ceramic coating may have a thickness ranging from about 100 microns to about 300 microns, such as about 200 microns.

Above the chamber lid 108, a radio frequency (RF) antenna including at least one inductive coil element 110 (two coaxial coil elements are shown) may be disposed. In some embodiments, the inductive coil elements 110 may be disposed around at least a portion of the chamber wall 106. One end of the inductive coil element 110 may be coupled, through a first impedance matching network 112, to an RF power source 114, and the other end may end may be connected to an electrical ground 117 as shown. The power source 114 typically is capable of producing up to 10 kilowatts (kW) at a tunable frequency in a range from 2 to 160 MHz, with 13.56 MHz being a typical operating frequency. The RF power supplied to the inductive coil elements 110 may be pulsed (i.e., switched between an on and an off state) or power cycled (i.e., varying a power input from a high level to a low level) at a frequency ranging from 1 to 100 kHz.

Interposed between the inductive coil elements 110 of the RF antenna and the chamber lid 108 may be a shielding electrode 118. The shielding electrode 118 may be alternately electrically floating or coupled to an electrical ground 119 via any suitable means for making and breaking an electrical connection, such as a switch 120 as illustrated in FIG. 1.

For some embodiments, a detector 122 may be attached to the chamber wall 106 in an effort to determine when a gas mixture within the chamber 100 has been energized into plasma. The detector 122 may, for example, detect the radiation emitted by the excited gases or use optical emission spectroscopy (OES) to measure the intensity of one or more wavelengths of light associated with the generated plasma.

The pedestal 104 may be coupled, through a second impedance matching network 124, to a biasing power source 126. The biasing power source 126 is generally capable of producing an RF signal having a tunable frequency ranging from 2 to 160 MHz and power between 0 and 10 kW, similar to the RF power source 114. Optionally, the biasing power source 126 may be a direct current (DC) or pulsed DC source.

In operation, a substrate 128, such as a semiconductor substrate, may be placed on the pedestal 104, and process gases may be supplied from a gas panel 130 through entry ports 132 in an effort to form a gaseous mixture 134. The entry ports 132 may be coated with the ceramic coating, such as HPM. The gaseous mixture 134 may be energized into a plasma 136 in the process chamber 100 by applying power from the RF power source 114. The pressure within the interior of the process chamber 100 may be controlled using a throttle valve 138 and a vacuum pump 140. In some embodiments, the temperature of the chamber wall 106 may be controlled using liquid-containing conduits (not shown) that run through the chamber wall 106 or heating elements embedded in the chamber wall 106 (e.g., heating cartridges or coils) or wrapped around the process chamber 100 (e.g., heater wrap or tape).

The temperature of the substrate 128 may be controlled by stabilizing the temperature of the pedestal 104. In some embodiments, helium (He) gas from a gas source 142 may be provided via a gas conduit 144 to channels (not shown) formed in the pedestal surface under the substrate 128. The helium gas may facilitate heat transfer between the pedestal 104 and the substrate 128. During processing, the pedestal 104 may be heated by a heating element (not shown), such as a resistive heater, embedded within the pedestal 104 or a lamp generally aimed at the pedestal 104 or the substrate 128 thereon, to a steady state temperature, and then the helium gas may facilitate uniform heating of the substrate 128. Using such thermal control, the substrate 128 may be maintained at a temperature between about 20 to 350 degrees Celsius (° C.).

In order to allow for control of the components of the process chamber 100 as described herein, a controller 146 may be provided. The controller 146 may comprise a central processing unit (CPU) 148, a memory 150, and support circuits 152 for the CPU 148. The controller 146 may interface with the RF power source 114, the switch 120, the detector 122, and the biasing power source 126.

The controller 146 may be any suitable type of general-purpose computer processor that can be used in an industrial setting for controlling various chambers and sub-processors. The memory 150, or other computer-readable medium, for the CPU 148 may be one or more of any readily available memory forms, such as random access memory (RAM), read only memory (ROM), a floppy disk, a hard disk, or any other form of digital storage, local or remote. The support circuits 152 may be coupled to the CPU 148 in an effort to support the processor in a conventional manner. These circuits may include cache, power supplies, clock circuits, input/output (I/O) circuitry and subsystems, and the like. For some embodiments, the techniques disclosed herein for energizing and maintaining a plasma may be stored in the memory 150 as a software routine. The software routine may also be stored and/or executed by a second CPU (not shown) that is remotely located from the hardware being controlled by the CPU 148.

Figure 2:
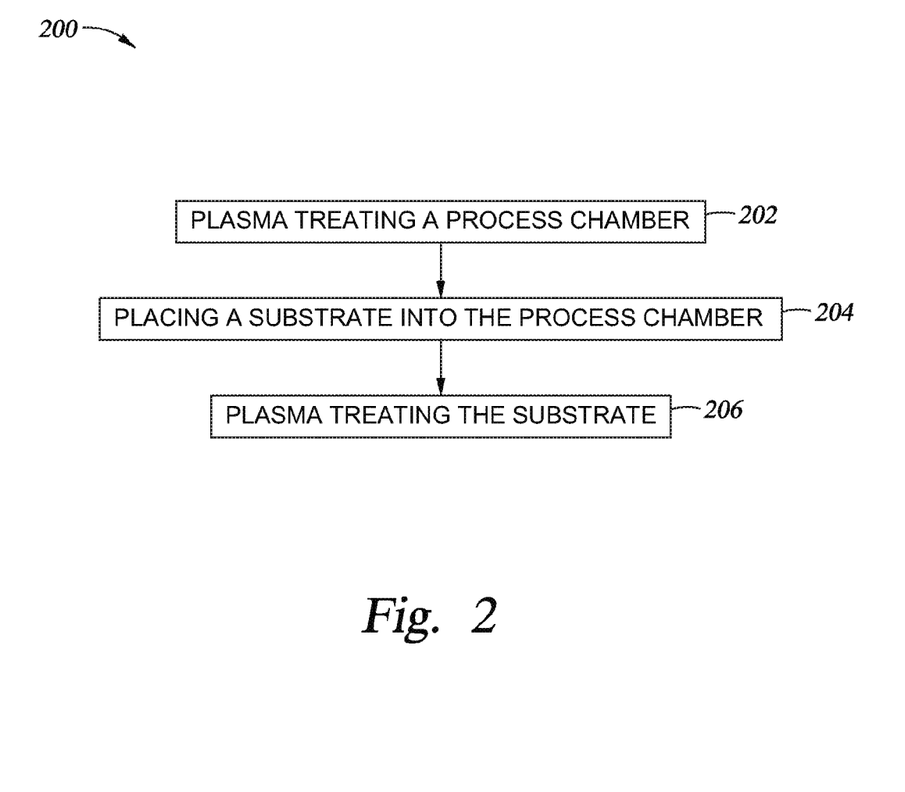
FIG. 2 illustrates a process for plasma treating a substrate placed in the process chamber shown in FIG. 1 according to embodiments described herein.
Figure 3A:
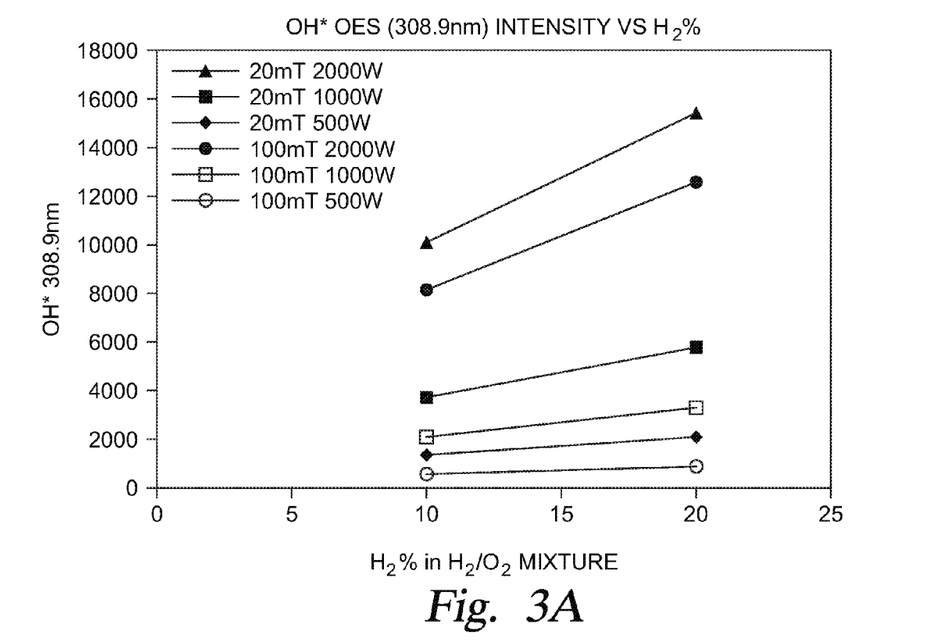
FIGS. 3A-3D are charts illustrating various $H_2$ percentages in $H_2$ and $O_2$ gas mixture at various pressure and RF power settings lead to different radical densities according to embodiments described herein.
Figure 3B:
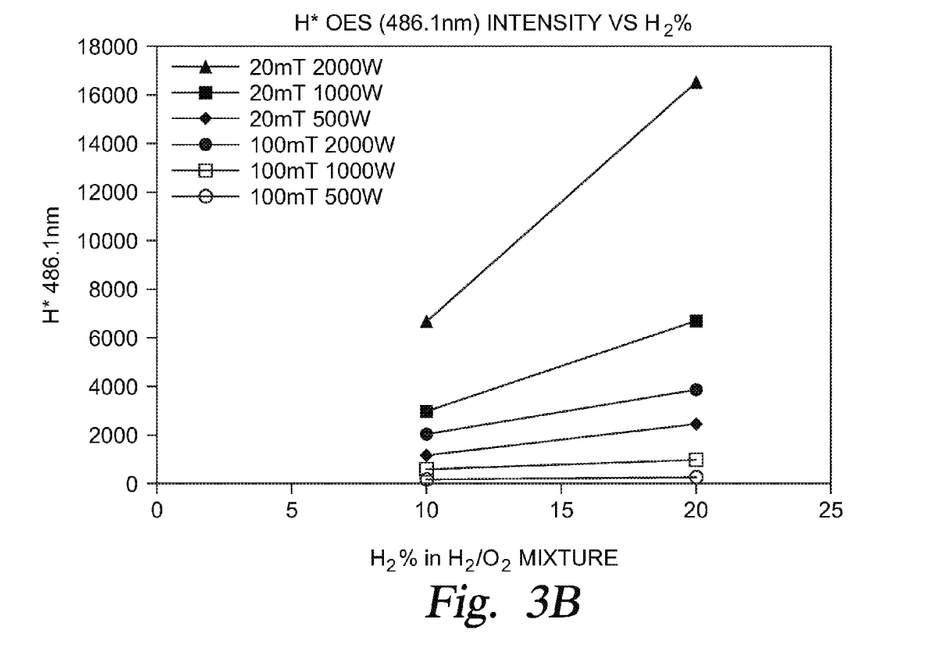
Figure 3C:
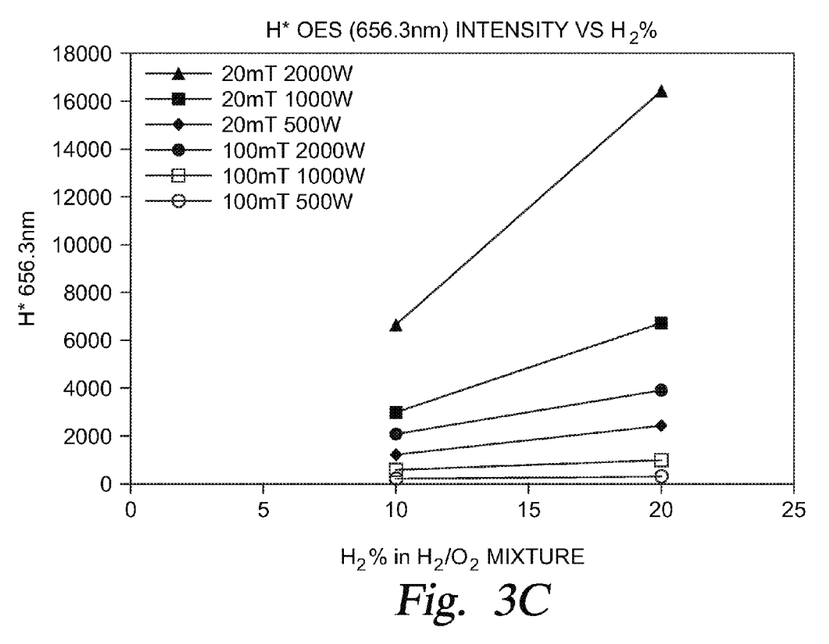
Figure 3D:
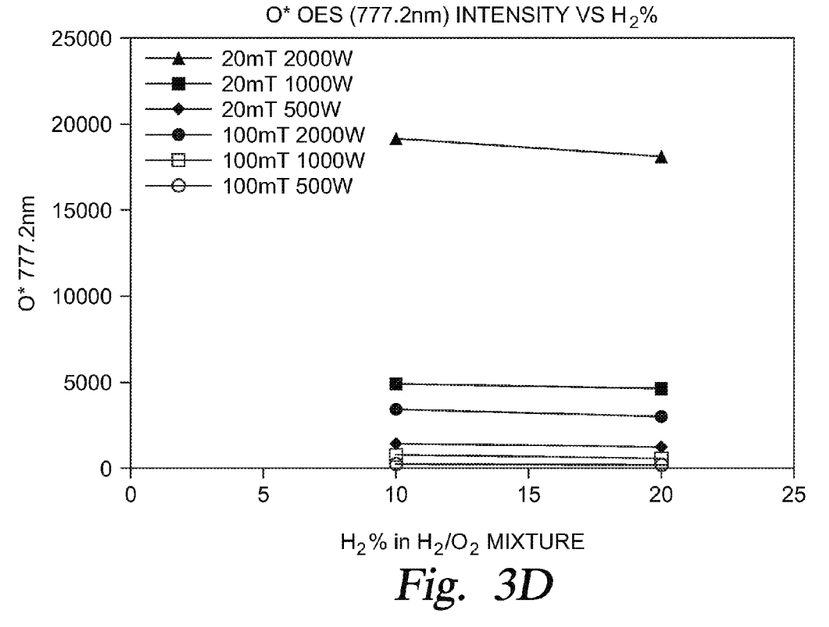

FIG. 2 illustrates a process 200 for plasma treating a substrate placed in the process chamber 100 according to embodiments described herein. Plasma treating as used herein refers to exposing the material to be treated by a plasma. The plasma may be capacitively coupled or inductively coupled. The plasma may be formed in-situ or may be remote. At block 202, a process chamber, such as the process chamber 100 (FIG. 1), is treated with a plasma without a substrate placed therein and before the substrate is treated with a $H_2$ plasma. The plasma treatment of the process chamber prior to introducing a substrate to the chamber may be referred to as Plasma Every Wafer (PEW). The plasma treating of the process chamber, or PEW, may include introducing one or more gases, such as $O_2$, $N_2$, $NH_3$, Ar, $H_2$, or combination thereof, into the process chamber, and energizing the one or more gases to form a plasma. Alternatively, PEW may include introducing a plasma containing radicals and/or ions of oxygen, nitrogen, hydrogen, ammonia, hydroxide or combination thereof into the process chamber, and the plasma is formed in a remote plasma source outside of the process chamber. In one embodiment, $NH_3$ and Ar gases are introduced into the process chamber. In another embodiment, $O_2$ and $H_2$ gases are introduced into the process chamber. In another embodiment, $O_2$ and Ar gases are introduced into the process chamber. In another embodiment, $O_2$ gas is introduced into the process chamber. In yet another embodiment, $N_2$ gas is introduced into the process chamber. Typically the plasma treatment of the processing chamber prior to introducing the substrate involves introducing or forming a plasma containing oxygen or nitrogen in the process chamber.

In some embodiments, the one or more gases are energized by an RF power source, such as the RF power source 114 (FIG. 1). The RF power may be pulsed at 2% to 70% duty cycle and may range from about 100 W to about 2500 W. The RF power may be a continuous wave ranging from about 100 W to about 2500 W. The process chamber may have a chamber pressure ranging from about 10 mT to about 200 mT during the plasma treatment of the process chamber. The process temperature, which may be the temperature of the substrate support pedestal, such as the pedestal 104, may range from 20° C. to about 500° C.

Radicals generated from the plasma inside the process chamber, such as O*, OH*, or NH*, can bond with surfaces of components of the process chamber that are susceptible to hydrogen containing plasma attack, and form protected surface bonds that are resistive to hydrogen containing plasma attack. For example, a chamber liner inside the process chamber may be made of anodized $Al_2O_3$, and some Al atoms with unsaturated bonds may form $AlH_x$ when exposed to H* radicals and $H_3^+$ ions generated from hydrogen containing plasma. $AlH_x$ may be etched away from the surface of the chamber liner, and may become a contaminant on the substrate. O*, OH*, or NH* radicals may repair the surface by bonding with the exposed Al atoms, and the newly formed bonds are resist to hydrogen containing plasma attack. Similarly, components inside the process chamber that are made of quartz are susceptible to hydrogen containing plasma attack, and may form contaminants such as SiOx on the substrate. Quartz components may also be protected by O*, OH*, or NH* radicals in similar fashion as the anodized $Al_2O_3$ components.

FIGS. 3A-3D are charts illustrating various $H_2$ percentages in $H_2$ and $O_2$ gas mixture at various pressure and RF power settings lead to different radical densities. The concentration of the radicals may depend on the RF power, such that higher RF power (2000 W) leads to higher concentration of radicals compared to lower RF power (500 W). The concentration of the radicals may also depend on pressure, such that lower pressure (20 mT) leads to higher concentration of radicals compared to higher pressure (100 mT). When the one or more gases are $H_2$ and $O_2$, the percent of $H_2$ by volume may range from about 10% to about 20%, and may lead to different densities of various radicals.

After the process chamber is treated with a plasma, a substrate, such as the substrate 128 (FIG. 1), is placed inside the process chamber, as shown at block 204. The substrate may include a gate stack formed thereon. At block 206, the substrate and the gate stack may be treated by a hydrogen containing plasma in order to cure the defects in the gate stack. The hydrogen containing plasma treating of the substrate may include introducing a hydrogen containing gas, such as $H_2$ gas, or a hydrogen containing gas and an inert gas, such as Ar gas, into the process chamber, and energizing the $H_2$ gas or $H_2$/Ar gases to form a hydrogen containing plasma. Ar gas may be added to the $H_2$ gas in order to improve the service lifetime of the process chamber (preventing the hydrogen containing plasma from attacking components inside the process chamber) and to modulate the H* radical concentrations. In some embodiments, the $H_2$ gas or $H_2$/Ar gases are energized by an RF power source, such as the RF power source 114 (FIG. 1). The RF power may be pulsed at 2% to 60% duty cycle and may range from about 100 W to about 2500 W. The RF power may be a continuous wave ranging from about 100 W to about 2500 W. The process chamber may have a chamber pressure ranging from about 10 mT to about 200 mT during the hydrogen containing plasma treatment of the substrate. The process temperature, which may be the temperature of the substrate support pedestal, such as the pedestal 104, may range from 20° C. to about 500° C. The substrate may be treated by the hydrogen containing plasma for about 10 to 360 seconds. In one embodiment, the chamber pressure is about 100 mT, the $H_2$ gas is flowed into the process chamber at about 25 standard cubic centimeters per minute (sccm) and Ar gas is flowed into the process chamber at about 975 sccm, the RF power is about 500 W, the process temperature is about 400° C., and the substrate is treated by the hydrogen containing plasma for about 30 to 90 seconds. After the substrate is treated with the hydrogen containing plasma, the substrate may be removed from the process chamber, and PEW may be performed on the process chamber prior to placing another substrate into the process chamber. In other words, blocks 202-206 may be repeated.

Figure 4A:
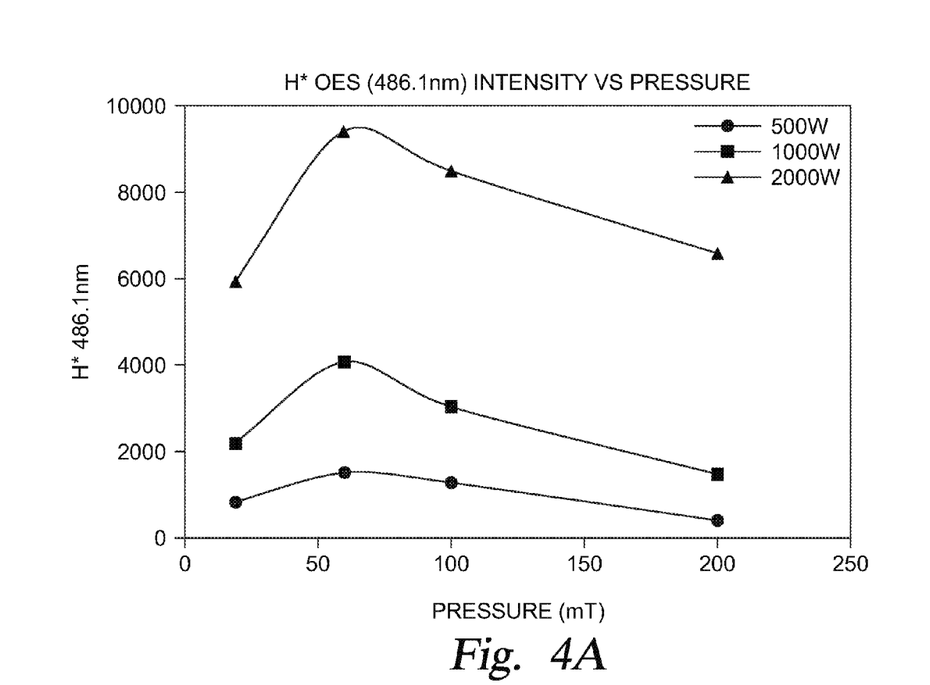
FIGS. 4A-4B are charts illustrating effect of RF power and pressure on radical concentration according to embodiments described herein.
Figure 4B:
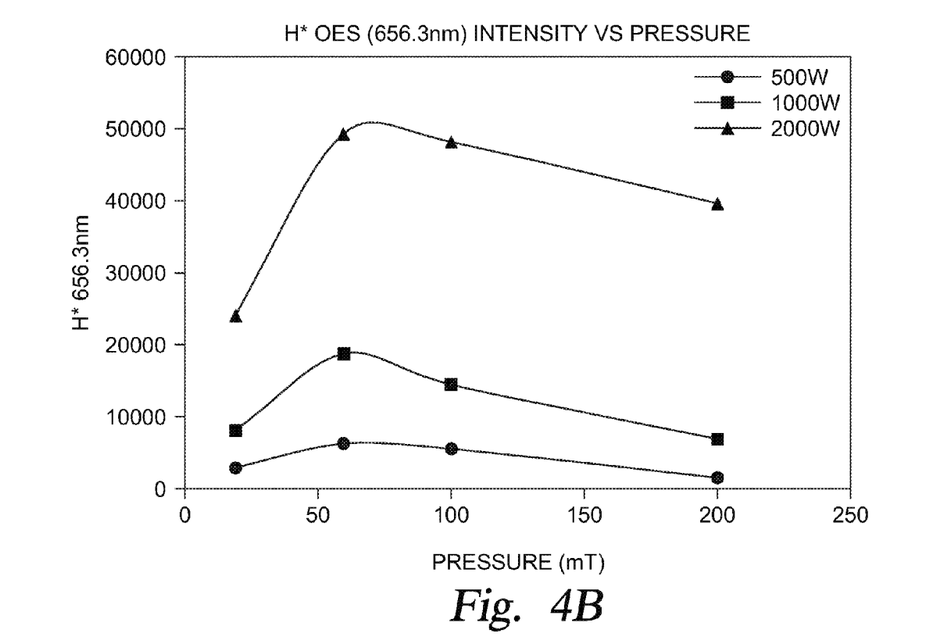

FIGS. 4A-4B are charts illustrating effect of RF power and pressure on radical concentration according to embodiments described herein. The concentration of the H* radicals may depend on the RF power, such that higher RF power (2000 W) leads to higher concentration of radicals compared to lower RF power (500 W). The concentration of the radicals may also depend on pressure, such that at higher pressure (200 mT) recombination of the H* radicals dominates. At about 60 mT, the concentration of the H* radicals are the highest.

Figure 5A:
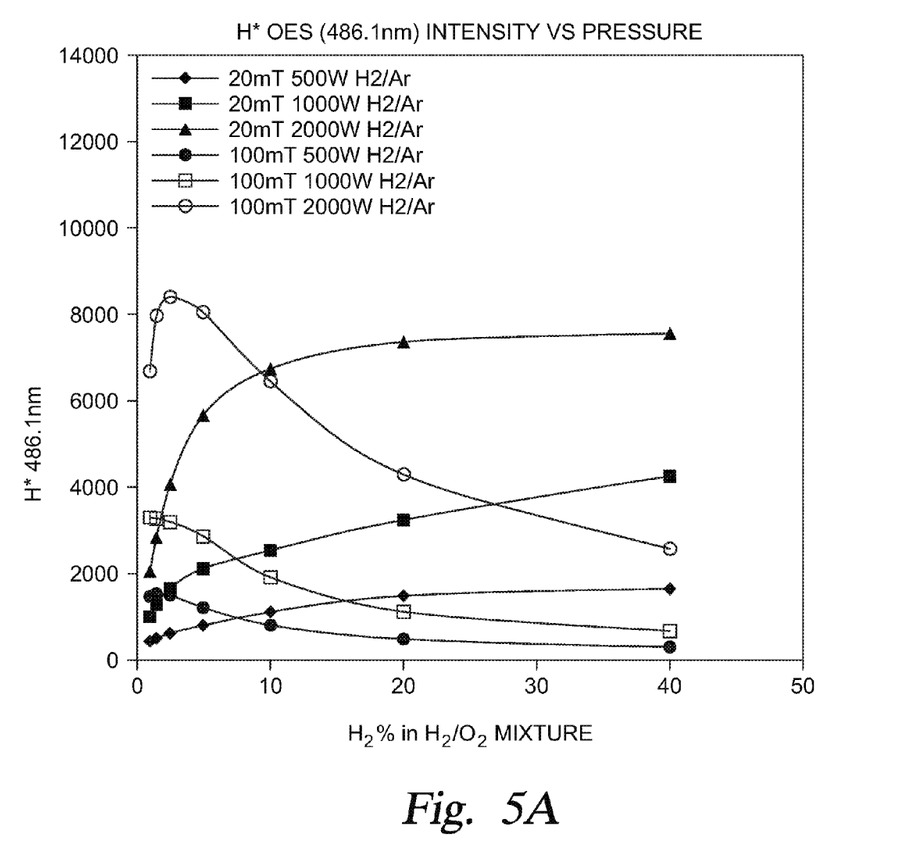
FIGS. 5A-5B are charts illustrating various $H_2$ percentages in $H_2$ and Ar gas mixture at various pressure and RF power settings lead to different radical densities according to embodiments described herein.
Figure 5B:
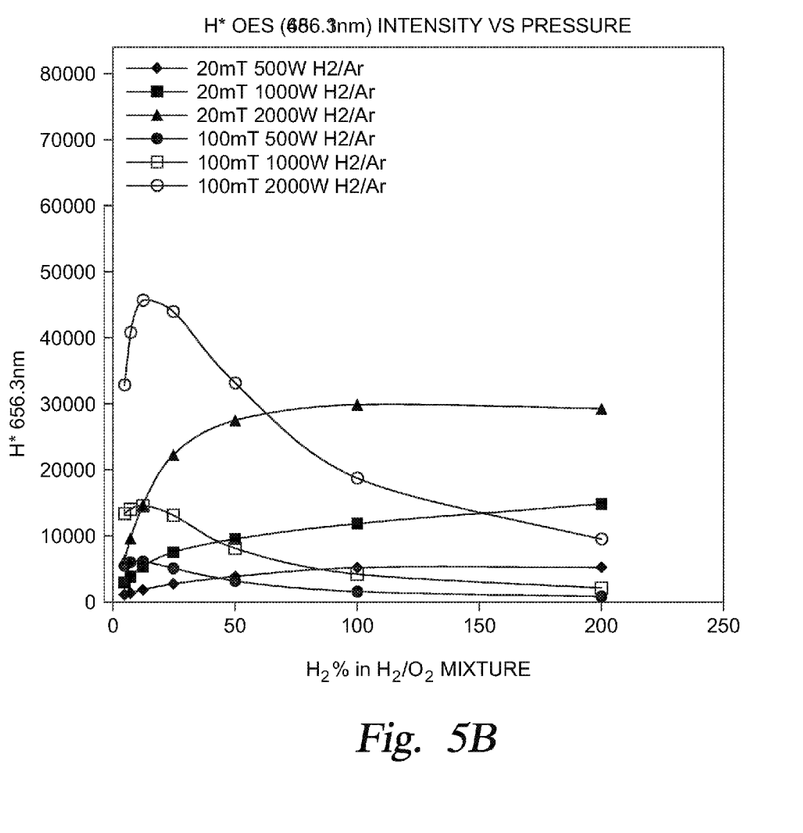
Figure 6A:
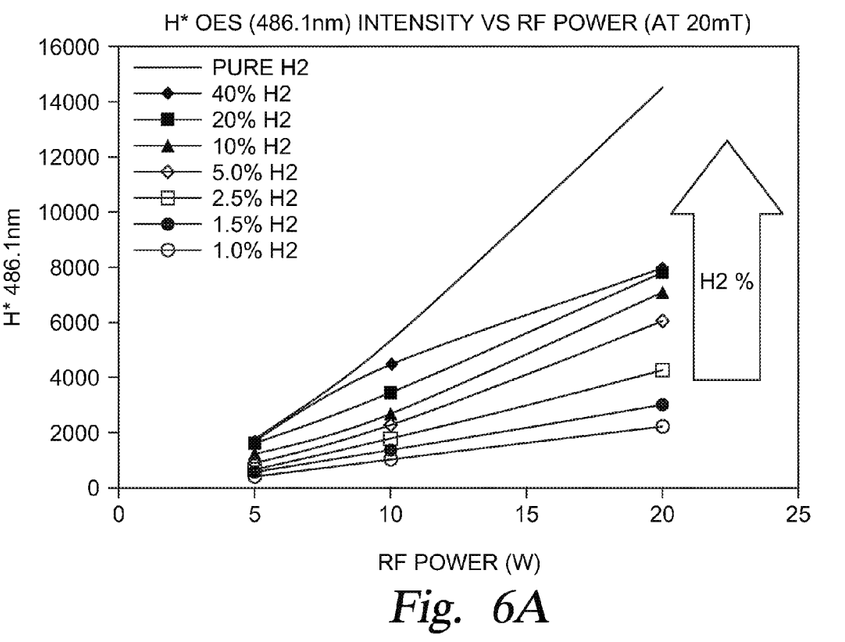
FIGS. 6A-6D are charts illustrating various $H_2$ percentages in $H_2$ and Ar gas mixture at various pressure and RF power settings lead to different radical densities according to embodiments described herein.
Figure 6B:
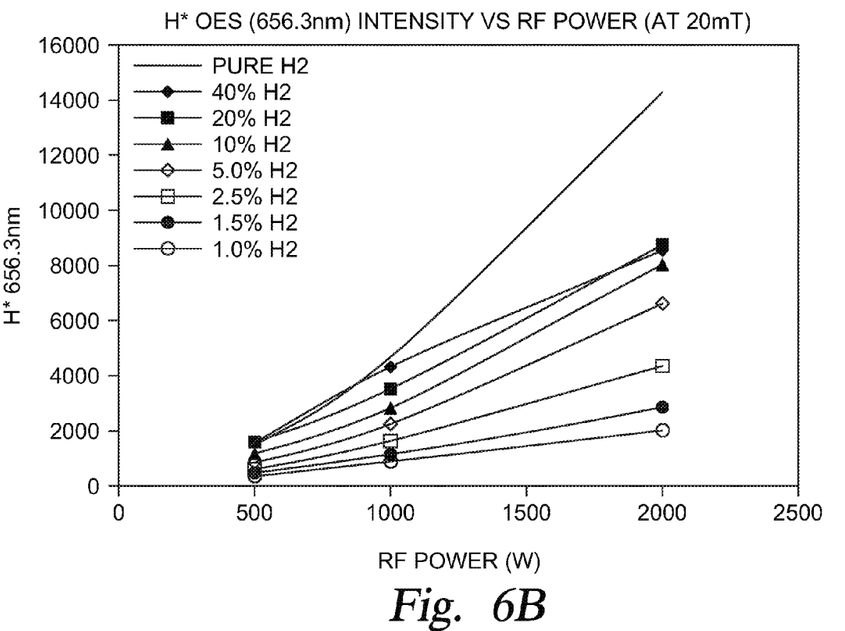
Figure 6C:
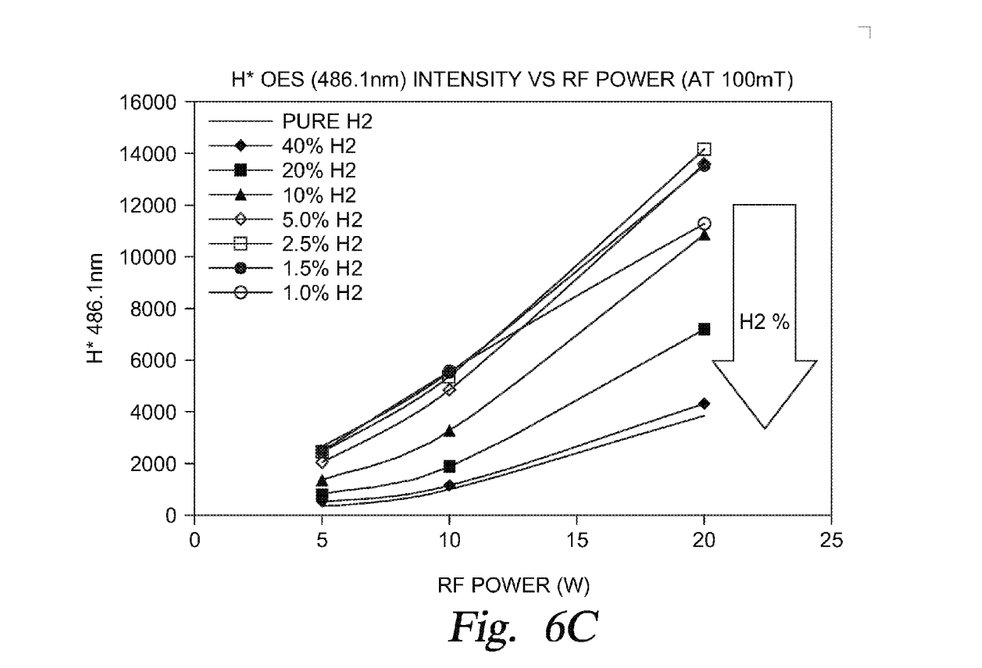
Figure 6D:
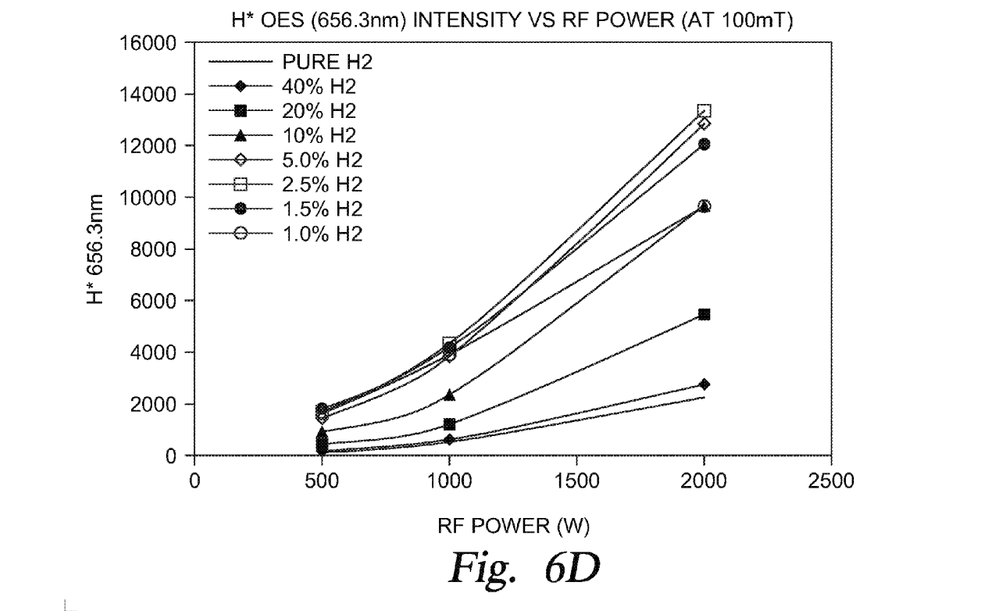

FIGS. 5A-5B are charts illustrating various $H_2$ percentages in $H_2$ and Ar gas mixture at various pressure and RF power settings lead to different radical densities according to embodiments described herein. As shown in FIGS. 5A and 5B, at low pressure, H* concentration increases with higher $H_2$ percent in $H_2$/Ar gas mixture, and at high pressure, H* concentration decreases with higher $H_2$ percent in $H_2$/Ar gas mixture.

FIGS. 6A-6D are charts illustrating various $H_2$ percentages in $H_2$ and Ar gas mixture at various pressure and RF power settings lead to different radical densities according to embodiments described herein. As shown in FIGS. 6A-6D, H* concentration increases when the RF power increases. In addition, at lower pressure (20 mT), H* concentration increases with higher volumetric percent of $H_2$ gas in $H_2$/Ar gas mixture. However, at higher pressure (100 mT), H* concentration increases with lower volumetric percent of $H_2$ gas in $H_2$/Ar gas mixture.

While the foregoing is directed to embodiments of the present disclosure, other and further embodiments of the disclosure may be devised without departing from the basic scope thereof, and the scope thereof is determined by the claims that follow.

The invention claimed is:

1. A method, comprising:
introducing a first one or more gases into a process chamber;
energizing the first one or more gases into a first plasma;
placing a substrate into the process chamber, wherein a stack is disposed on the substrate;
introducing a second one or more gases into the process chamber;
energizing the second one or more gases into a second plasma; and
repeating the introducing a first one or more gases into a process chamber, the energizing the first one or more gases into a first plasma, the placing a substrate into the process chamber, the introducing a second one or more gases into the process chamber, and the energizing the second one or more gases into a second plasma.

2. The method of claim 1, wherein the first one or more gases comprise $O_2$, $N_2$, $NH_3$, Ar, $H_2$, or combination thereof.

3. The method of claim 2, wherein radicals in the first plasma bond with surfaces of components of the process chamber to form protected surface bonds that are resistive to hydrogen containing plasma attack.

4. The method of claim 1, wherein the second one or more gases comprise a hydrogen containing gas.

5. The method of claim 4, wherein the second one or more gases further comprises an inert gas.

6. The method of claim 5, wherein the second one or more gases comprises Ar and H2.

7. A method, comprising:
introducing a first one or more gases into a process chamber, wherein the first one or more gases comprise $O_2$, $N_2$, $NH_3$, Ar, $H_2$, or combination thereof;
energizing the first one or more gases into a first plasma;
placing a substrate into the process chamber, wherein a stack is disposed on the substrate;
introducing a second one or more gases into the process chamber, wherein the second one or more gases comprises $H_2$;
energizing the second one or more gases into a second plasma; and
repeating the introducing a first one or more gases into the process chamber, the energizing the first one or more gases into a first plasma, the placing a substrate into the process chamber, the introducing a second one or more gases into the process chamber, and the energizing the second one or more gases into a second plasma.

8. The method of claim 7, wherein radicals in the first plasma bond with surfaces of components of the process chamber to form protected surface bonds that are resistive to hydrogen containing plasma attack.

9. The method of claim 7, wherein the second one or more gases further comprises an inert gas.

10. The method of claim 9, wherein the second one or more gases comprises Ar and $H_2$.

* * * * *